(12) United States Patent
Hill

(10) Patent No.: US 7,075,619 B2
(45) Date of Patent: Jul. 11, 2006

(54) IN-PROCESS CORRECTION OF STAGE MIRROR DEFORMATIONS DURING A PHOTOLITHOGRAPHY EXPOSURE CYCLE

(75) Inventor: Henry A. Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 0 days.

(21) Appl. No.: 10/734,994

(22) Filed: Dec. 12, 2003

(65) Prior Publication Data

US 2004/0135980 A1    Jul. 15, 2004

Related U.S. Application Data

(60) Provisional application No. 60/432,848, filed on Dec. 12, 2002.

(51) Int. Cl.
   *G03B 27/42* (2006.01)
   *G03B 27/32* (2006.01)
   *G01B 11/02* (2006.01)
   *G01B 9/02* (2006.01)

(52) U.S. Cl. .................... 355/53; 355/77; 356/500; 356/487

(58) Field of Classification Search ............... 355/53, 355/52, 55, 77; 356/500, 498, 487, 493, 356/358
   See application file for complete search history.

(56) References Cited

U.S. PATENT DOCUMENTS

| 4,606,638 | A | 8/1986 | Sommargren |
| 4,662,750 | A | 5/1987 | Barger |
| 4,711,573 | A | 12/1987 | Wijntjes et al. |
| 4,790,651 | A | 12/1988 | Brown et al. |
| 4,802,765 | A | 2/1989 | Young et al. |
| 4,859,066 | A | 8/1989 | Sommargren |
| 4,881,816 | A | 11/1989 | Zanoni |
| 4,948,254 | A | 8/1990 | Ishida |
| 5,064,289 | A | 11/1991 | Bockman |
| 5,114,234 | A | 5/1992 | Otsuka et al. ............... 356/358 |
| 5,151,749 | A | 9/1992 | Tanimoto et al. ........... 356/375 |
| 5,187,543 | A | 2/1993 | Ebert .......................... 356/349 |
| 5,331,400 | A | 7/1994 | Wilkening et al. |
| 5,363,196 | A | 11/1994 | Cameron .................... 356/358 |
| 5,404,222 | A | 4/1995 | Lis |
| 5,408,318 | A | 4/1995 | Slater |
| 5,483,343 | A | 1/1996 | Iwamoto et al. |
| 5,491,550 | A | 2/1996 | Dabbs |
| 5,663,793 | A | 9/1997 | de Groot |

(Continued)

FOREIGN PATENT DOCUMENTS

JP    8-117083    4/1996

(Continued)

OTHER PUBLICATIONS

Badami et al. "Investigation of NonLinearity in High Accuracy Heterodyne Laser Interferometry." American Society for Precision Engineering, 1997 Proceedings, 16, pp. 153-156, 1997.

(Continued)

*Primary Examiner*—Peter B. Kim
(74) *Attorney, Agent, or Firm*—Fish & Richardson P.C.

(57) ABSTRACT

A microlithography method includes: interferometrically measuring information about a position of a microlithography stage with respect to each of multiple metrology axes during a photolithographic exposure cycle; analyzing the position information to determine correction factors indicative of a local slope on a side of the stage used to reflect an interferometric measurement beam and optical gradients caused by environmental effects produced by the photolithographic exposure cycle; and applying the correction factors to subsequent interferometric measurements of the stage.

26 Claims, 9 Drawing Sheets

U.S. PATENT DOCUMENTS

| | | |
|---|---|---|
| 5,663,893 A | 9/1997 | Wampler et al. |
| 5,715,057 A | 2/1998 | Bechstein et al. |
| 5,724,136 A | 3/1998 | Zanoni |
| 5,757,160 A | 5/1998 | Kreuzer |
| 5,757,489 A | 5/1998 | Kawakami |
| 5,764,361 A | 6/1998 | Kato et al. ............... 356/358 |
| 5,764,362 A | 6/1998 | Hill et al. |
| 5,781,277 A | 7/1998 | Iwamoto |
| 5,790,253 A | 8/1998 | Kamiya ................. 356/363 |
| 5,801,832 A | 9/1998 | Van Der Brink |
| 5,838,485 A | 11/1998 | De Groot et al. |
| 5,862,164 A | 1/1999 | Hill |
| 5,877,843 A | 3/1999 | Takagi et al. |
| 5,917,844 A | 6/1999 | Hill |
| 5,951,482 A | 9/1999 | Winston et al. |
| 5,970,077 A | 10/1999 | Hill |
| 5,991,033 A * | 11/1999 | Henshaw et al. .......... 356/487 |
| 6,008,902 A | 12/1999 | Rinn |
| 6,020,964 A | 2/2000 | Loopstra et al. ........... 356/358 |
| 6,040,096 A | 3/2000 | Kakizaki et al. |
| 6,046,792 A | 4/2000 | Van Der Werf et al. |
| 6,124,931 A | 9/2000 | Hill |
| 6,134,007 A | 10/2000 | Naraki et al. ............ 356/358 |
| 6,137,574 A | 10/2000 | Hill |
| 6,157,660 A | 12/2000 | Hill |
| 6,159,644 A | 12/2000 | Satoh |
| 6,160,619 A | 12/2000 | Magome |
| 6,181,420 B1 | 1/2001 | Badami et al. |
| 6,201,609 B1 | 3/2001 | Hill et al. |
| 6,208,424 B1 | 3/2001 | de Groot |
| 6,219,144 B1 | 4/2001 | Hill et al. |
| 6,236,507 B1 | 5/2001 | Hill et al. |
| 6,246,481 B1 | 6/2001 | Hill |
| 6,252,667 B1 | 6/2001 | Hill et al. |
| 6,252,668 B1 | 6/2001 | Hill |
| 6,271,923 B1 | 8/2001 | Hill ........................ 356/487 |
| 6,304,318 B1 | 10/2001 | Matsumoto |
| 6,313,918 B1 | 11/2001 | Hill et al. ................. 356/498 |
| 6,327,039 B1 | 12/2001 | de Groot et al. |
| 6,330,065 B1 | 12/2001 | Hill |
| 6,330,105 B1 | 12/2001 | Rozelle et al. |
| 6,384,899 B1 | 5/2002 | den Boef |
| 6,417,927 B1 | 7/2002 | de Groot |
| 6,541,759 B1 | 4/2003 | Hill |
| 6,700,665 B1 | 3/2004 | Hill |
| 6,710,884 B1 | 3/2004 | Hill |
| 6,738,143 B1 | 5/2004 | Chu |
| 6,813,022 B1 | 11/2004 | Inoue |
| 6,839,141 B1 | 1/2005 | Hill |
| 2001/0035959 A1 | 11/2001 | Hill ........................... 356/500 |
| 2002/0001086 A1 | 1/2002 | de Groot |
| 2002/0048026 A1 | 4/2002 | Isshiki et al. |
| 2002/0089671 A1 | 7/2002 | Hill |
| 2003/0035114 A1 | 2/2003 | Hill |
| 2003/0053074 A1 | 3/2003 | Hill ........................... 356/500 |
| 2003/0090675 A1 | 5/2003 | Fujiwara |
| 2004/0046965 A1 | 3/2004 | Hill |
| 2005/0237536 A1 | 10/2005 | Hill |
| 2005/0248772 A1 | 11/2005 | Hill et al. |

FOREIGN PATENT DOCUMENTS

| | | |
|---|---|---|
| JP | 9-178415 | 7/1997 |
| JP | 9-280822 | 10/1997 |
| JP | 10260009 A | 9/1998 |
| WO | WO 01/90686 | 11/2001 |

OTHER PUBLICATIONS

Bennett, S.J.. "A Double-Passed Michelson Interferometer." Optics Communications, 4:6, pp. 428-430, 1972.

Bobroff, Norman. "Recent advances in displacement measuring interferometry." Meas. Sci. Technol. 4, pp. 907-926, 1993.

Bobroff, Norman. "Residual errors in laser interferometry from air turbulence and nonlinearity." Applied Optics, 26:13, pp. 2676-2686, 1987.

Hines et al. Sub-Nonometer Laser Metrology—Some Techniques and Models. ESO Conference on High-Resolution Imaging by Interferometry II, pp. 1195-1204, 1991.

Mauer, Paul. "Phase Compensation of Total Internal Reflection." J. Opt. Soc. Am., 56:9, pp. 1219-1221, 1966/.

Oka et al. "Polarization heterodyne interferometry using another local oscillator beam." Optics Communications, 92, pp. 1-5, 1992.

Player, M.A. "Polarization properties of a cube-corner reflector." J. Mod. Opt., 35:11, pp. 1813-1820, 1988.

Wu et al. "Analytical modeling of the periodic nonlinearity in heterodyne interferometry." Applied Optics, 37:28, pp. 6696-6700, 1998.

* cited by examiner

IN-PROCESS CORRECTION OF STAGE MIRROR DEFORMATIONS DURING A PHOTOLITHOGRAPHY EXPOSURE CYCLE

CROSS-REFERENCE TO RELATED APPLICATIONS

This application claimes priority under 35 USC 119(e) to U.S. Provisional Patent Application Ser. No. 60/432,848 by Henry A. Hill filed Dec. 12, 2002 and entitled "IN-PROCESS CORRECTION OF STAGE MIRROR DEFORMATIONS DURING A PHOTOLITHOGRAPHY EXPOSURE CYCLE," the contents of which is incorporated herein by reference.

BACKGROUND

This invention in general relates to interferometrically measurements associated with a photolithographic stage.

Interferometry is a well established metrology used extensively in microfabrication processes to measure and control a host of critical dimensions. It is especially important in manufacturing semiconductors and the like where requirements for precision are one or more orders of magnitude better than critical dimensions of approximately 100 nm or below.

Integrated circuits made of semiconductor materials are constructed by successively depositing and patterning layers of different materials on a silicon wafer. The patterning process consists of a combination of exposure and development of photoresist followed by etching and doping of the underlying layers and deposition of another layer. Typically each wafer contains multiple copies of the same pattern called "fields" arrayed on the wafer in a nominally rectilinear distribution known as the "grid." Often, but not always, each field corresponds to a single "chip."

The exposure process includes projecting the image of the next layer pattern onto (and into) the photoresist that has been spun onto the wafer. For the integrated circuit to function properly each successive projected image must be accurately matched to the patterns already on the wafer. The process of determining the position, orientation, and distortion of the patterns already on the wafer, and then placing them in the correct relation to the projected image, is termed "alignment." The actual outcome, i.e., how accurately each successive patterned layer is matched to the previous layers, is termed "overlay."

In general, the alignment process requires both translational and rotational positioning of the wafer and/or the projected image as well as some distortion of the image to match the actual shape of the patterns already present. It is is important that the wafer and the image be positioned correctly to get one pattern on top of the other. Alignment may also address distortion of the image. Other effects, such as thermal and vibration, may require compensation as well.

Alignment is generally implemented as a two-step process; that is, a fine alignment step with an accuracy of nanometers or even subnanometers to tens of nanometers follows an initial coarse alignment step with an accuracy of microns, and alignment requires positioning the wafer in all six degrees of freedom: three translation and three rotation. It is common, however, to consider adjusting the wafer so that it lies in the projected image plane, i.e., leveling and focusing the wafer, which involves one translational degree of freedom (motion along the optic axis, the—axis or a parallel normal to the—wafer orientation) and two rotational degrees of freedom (orienting the plane of the wafer to be parallel to the projected image plane), to be considered separate from alignment. Thus, "alignment" typically refers to in-plane translation (two degrees of freedom) and rotation about the projection optic axis (one degree of freedom).

The reason for this separation in nomenclature is the difference in accuracy required. The accuracy required for in-plane translation and rotation generally needs to be on the order of nanometers to tens of nanometers or of the order of 1% of the minimum feature size or critical dimension (CD) to be printed on the wafer. Current state-of-the-art CD values are on the order of several hundred nanometers and thus the required alignment accuracy is less than 100 nm. On the other hand, the accuracy required for out-of-plane translation and rotation is related to the total usable depth of focus of the exposure tool, which is generally close to the CD value. Thus, out-of-plane focusing and leveling the wafer require less accuracy than in-plane alignment.

In-plane alignment typically involves the use multiple axes interferometer systems monitoring changes in the position of the wafer stage or reticle. For example, a suitable interferometry system includes that disclosed in U.S. Pat. No. 5,801,832 entitled "Method Of And Device For Repetitively Imaging A Mask Pattern On A Substrate Using Five Measuring Axes" by M. A. Van Den Brink, which involve distance measuring interferometers as high-stability plane mirror interferometers (HSPMI).

Distance measuring interferometers monitor changes in the position of a measurement object relative to a reference object based on an optical interference signal. The interferometer generates the optical interference signal by overlapping and interfering a measurement beam reflected from the measurement object with a reference beam reflected from a reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam-splitter to direct the measurement and reference beams to the measurement and reference objects, respectively, and combine the reflected measurement and reference beams to form overlapping exit measurement and reference beams. The overlapping exit beams form an output beam that subsequently passes through a polarizer. The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams.

A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where v is the relative speed of the measurement and reference objects, $\lambda$ is the wavelength of the measurement and reference beams, n is the refractive index of the medium through which the light beams travel, e.g., air or vacuum, and p is the number of passes to the reference and measurement objects.

Changes in the phase of the measured interference signal correspond to changes in the relative position of the measurement object, e.g., a change in phase of $2\pi$ corresponds substantially to a distance change L of $\lambda/(2np)$. Distance 2L is a round-trip distance change or the change in distance to and from a stage that includes the measurement object. In other words, the phase $\Phi$, ideally, is directly proportional to L, and can be expressed as $\Phi=2pkL\cos^2\theta$, for a plane mirror interferometer, e.g., a high stability plane mirror interferometer, where $$k = \frac{2\pi n}{\lambda}$$

and $\theta$ is the orientation of the measurement object with respect to a nominal axis of the interferometer. This axis can be determined from the orientation of the measurement object where $\Phi$ is maximized. Where $\theta$ is small, $\Phi$ can be approximated by $\Phi=2pkL(1-\theta^2)$.

In some embodiments, multiple distance measuring interferometers can be used to monitor multiple degrees of freedom of a measurement object. For example, interferometry systems that include multiple displacement interferometers are used to monitor the location of a plane mirror measurement object in lithography tools. Monitoring the location of a stage mirror relative to two parallel measurement axes provides information about the angular orientation of the stage mirror relative to an axis normal to the plane in which the two measurement axes lie. Such measurements allow a user to monitor the location and orientation of the stage relative to other components of the lithography tool to relatively high accuracy.

Unfortunately, such interferometric stage measurements are sometimes degraded by deformations and/or imperfectations in stage mirrors used to reflect interferometric measurement beams. For example, such mirrors may have local variations in slope that misdirect the measurement beam(s), and which, if not corrected, may be misinterpreted as, e.g., an in-plane rotation of the stage. The stage mirrors are typically elongate mirrors laminated to a wafer or reticle stage. Such mirrors may be characterized before installation in a lithography tool to provide such a correction. However, the installation of the stage mirrors itself may cause additional deformations to them, which would not be characterized.

SUMMARY

The present invention relates to a method for characterizing imperfections in the stage mirrors that redirect interferometric measurement beam(s) used to monitor the position of a wafer or reticle stage during a photolithographic exposure cycle. In important feature of the invention is that the method occurs "in-process," i.e., it takes place during a photolithography exposure cycle used, e.g., to fabricate integrated circuits.

As used herein, a photolithography exposure cycle refers to the part of a wafer process in which a lithography tool actually exposes one or more regions of a photoresist on the wafer with illumination light. Accordingly, the mirror characterization takes place as a wafer stage and/or a reticle stage is moved (e.g., scanned or stepped) to accomodate actual exposure of a wafer substrate. The mirror characterization information can then by used to improve alignment accuracy in the photolithography exposure cycle for subsequent regions or layers of the same wafer, or for subsequent wafers.

The inventor has recognized that what is important to characterize is not necessarily the actual physical deformation of the stage mirror, but its "effective" optical deformation with respect to the interferometric measurement beam (s) during the photolithography exposure cycle. This effective optical deformation includes not only physical deformations in the mirrors, but also optical gradients along the measurement beam path caused by environmental effects, such as heat and air turbulence, produced by the movement of the stage during the photolithography exposure cycle. Such optical gradients can modify the propagation properties of the interferometric measurement beams in the same way as physical deformations in the mirrors. Thus, the present method implements a mirror characterization procedure in-process to incorporate the environmental effects into the characterization. The characterization is then used to correct in-process interferometric measurements of the stage.

Accordingly, the corrections account for pre-installation imperfections in the mirrors, deformations in the mirror caused by their installation, and environmental effects during a photolithographic exposure cycle that affect how the mirror surface "appears" to the interferometer used to monitor the stage position. Moreover, the corrections compensate for any in-process degradation of the mirror surfaces due to, e.g., delamination or dirt. Furthermore, the corrections may be averaged and continually updated during multiple cycles of the photolithography exposure cycle to improve their statistically accuracy without compromising the throughput of the lithography tool.

Also, the mirror characterization technique improves throughput of the lithography tool because the characterization takes place during production, rather than during a pre-production calibration process.

The mirror characterization technique is based on interferometrically measuring the stage position with respect to multiple metrology axes to provide redundant information about the stage position. For example, in-plane rotation of the wafer stage may be measured twice based on separate interferometric measurement beams that contact two different sides of the wafer stage. The two in-plane rotation measurements may then be repeated as the position of the stage is stepped or scanned along a first axis. Differences between the multiple redundant measures may then be attributed to the effective optical deformation of a first stage mirror oriented parallel to that first axis. The process may then be repeated for multiple translations of the stage along a second axis orthogonal to the first axis to determine the effective optical deformation of a second stage mirror oriented parallel to the second axis. This stage translation process is typical of "step and scan" processes used in many photolithography exposure cycles.

In preferred embodiments, single-beam interferometers are used to monitor the stage position. A "single-beam" interferometer is an interferometer that directs only a single measurement beam to contact the stage mirror to provide measurement information about multiple measurement coordinates (e.g., distance and one or more angles).

In general, in one aspect, the invention features a microlithography method including: interferometrically measuring information about a position of a microlithography stage with respect to each of multiple metrology axes during a photolithographic exposure cycle; analyzing the position information to determine correction factors indicative of a local slope on a side of the stage used to reflect an interferometric measurement beam and optical gradients caused by environmental effects produced by the photolithographic exposure cycle; and applying the correction factors to subsequent interferometric measurements of the stage.

The method may include any of the following features.

The stage may carry a wafer exposed to illumination light during the photolithographic exposure cycle.

The stage may carry a reticle through which illumination light passes to expose a wafer during the photolithographic exposure cycle.

The information may be measured when exposing a first region of a wafer during the photolithography exposure cycle, and the correction factors may be applied to subsequent interferometric measurements of the stage when exposing subsequent regions or layers of the wafer during the photolithography exposure cycle.

The information may be measured when exposing a first region of a wafer during the photolithography exposure cycle, and the correction factors may be applied to subsequent interferometric measurements of the stage when exposing a region of another wafer during its photolithography exposure cycle.

The correction factors may be determined based on averaging information for multiple scans of the stage along at least a first direction.

The position information may be measured using at least one high stability plane mirror interferometer.

The position information may measured using at least one single beam interferometer. For example, the single beam interferometer may be a dynamic single beam interferometer or a passive single beam interferometer.

The correction factors may be indicative of the local slope on at least two sides of the stage used to reflect an interferometric measurement beam.

The correction factors may be indicative of the local slope of the side of the stage along an in-plane direction.

The multiple metrology axes may provide redundant information about the stage position in the absence of the local slope and optical gradient variations.

In another aspect, the invention features a method including fabricating integrated circuits using the lithography method described above.

Unless otherwise defined, all technical and scientific terms used herein have the same meaning as commonly understood by one of ordinary skill in the art to which this invention belongs. In case of conflict with publications, patent applications, patents, and other references mentioned incorporated herein by reference, the present specification, including definitions, will control.

Other aspects, features, and advantages of the invention follow.

BRIEF DESCRIPTION OF THE DRAWINGS

Like reference symbols in the various drawings indicate like elements.

DETAILED DESCRIPTION

The invention features a method by which the shapes of on-stage or off-stage reflecting elements may be monitored in-situ during in-process wafer scanning to develop correction signals that compensate for errors in optical path lengths and in beam directions related to temporal changes in shapes of the reflecting surfaces as seen by the interferometric measuring system, including optical gradients in the measurement beam paths caused by environmental effects produced during the in-process, photolithographic exposure cycle. Typically, the reflecting surfaces are arranged in orthogonal planes.

Figure 1:
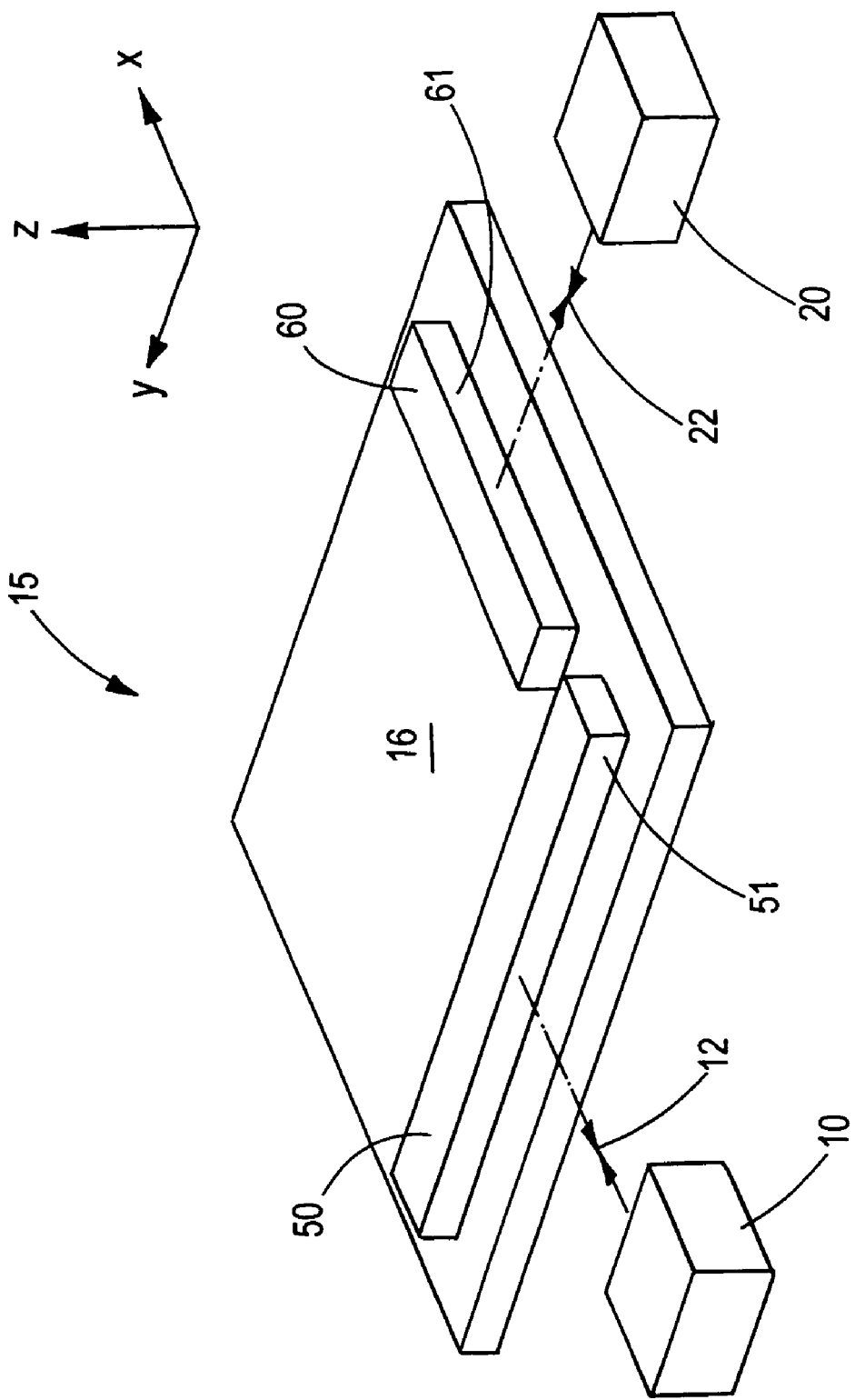
FIG. 1 is a persepective view of an embodiment of an interferometric stage system.

Reference is now made to FIG. 1 which is a diagrammatic perspective view of an interferometric system 15 that employs a pair of interferometry systems 10 and 20 by which the shape of an on-stage mounted elongated high aspect ratio object mirror may be characterized in-situ and during a wafer in-process scanning along a datum line. As shown in FIG. 1, system 15 comprises a stage 16 that preferably forms part of a photolithographic apparatus for fabricating semiconductor products such as integrated circuits or chips. Affixed to stage 16 is a thin, high aspect ratio planar mirror 50 having a y-z reflective surface 51 elongated in the y-direction. Also, fixedly mounted to stage 16 is another thin, high aspect ratio planar mirror 60 having an x-z reflective surface 61 elongated in the x-direction. Mirrors 50 and 60 are mounted on stage 16 so that their reflective surfaces, 51 and 61, respectively, are nominally orthogonal to one another. Stage 16 is otherwise mounted in a well-known manner for nominally plane translation but may experience small angular rotations about the x, y, and z axes due to bearing and drive mechanism tolerances and changes introduced to compensate for departures of a wafer surface from a planar surface. Interferometry systems 10 and 20 each direct one or more beams (shown schematically as beams 12 and 22, respectively, in FIG. 1) to contact mirrors 50 and 60, respectively. Based on such beams, interferometry systems 10 and 20 measure displacements along the x-and y-axes, respectively. Furthermore, they also each measure in-plane rotation of the stage 16, that is rotation about that z-axis. In some embodiments, the interferometry systems may also be configured to measure out-of-plane rotation of the stage.

During a typical photolithography exposure cycle, stage 16 is stepped or scanned along one of the in-plane coordinates (e.g., along the y-direction), while tile other in-plane coordinate (e.g., the x-coordinate) is nominally fixed. The stepping or scanning (e.g., along the y-direction) is then repeated for additional settings of the other in-plane coordinate (e.g., the x-coordinate). During this process the interferometry systems provide information that can be used to characterize surface deformations of the stage mirrors.

For example, as stage 16 is translated in the y-direction, beam(s) 12 from interferometry system 10 scans the mirror surface 51 along a datum line and generates a signal containing information indicative of its angular orientation and surface departure in the x-direction, along with any contributions due to variations in the translation mechanism for moving stage 16. Simultaneous with translation of stage 16 in the y-direction, interferometry system 20 monitors a single point on mirror 61 corresponding to the intercept point of beam(s) 22 with reflecting surface 61. This step permits measurement of the rotation of stage 16 due to mechanical contributions of its translation mechanism, such as bearings, drive mechanisms, and the like. With this information, two signals are generated. The first from interferometry system 10 which contains information about the change in slope of the mirror surface 51 along a datum line, and the second from interferometry system 20 which contains information about the angular orientation of stage 16. These two signals are combined to extract information about the slope of mirror 51 along its datum line datum line, i.e., dx/dy. This information can then be integrated to obtain the surface deformation x as a function of position y. Moreover, because the information is obtained in-process (i.e., during the photolithography exposure cycle), it incorporates information about not only physical deformations in the mirrors, but also optical gradients along the measurement beam path caused by environmental effects, such as heat and air turbulence, produced by the movement of the stage during the photolithography exposure cycle. As result, when used to correct alignment of the stage during subsequent steps in the photolithography exposure cycle, the information can provide greater accuracy than a mirror calibration not performed in-process. In other words, the in-process calibration is more accurate because it is made during the same working environment and under the same conditions as that in which it is used to correct alignment of the stage. Furthermore, the accuracy of the calibration may be improved by averaging of the information from two or more scans in the y-direction to reduce the effect of statistical errors.

Information about surface deformation of mirror 61 can be made in a similar manner. For example, its mirror characterization can be from in-process operations in which stage 16 is translated in the x-direction while the y-coordinate is fixed. Alternatively, such data can be obtained by stitched together from a series of y-coordinate scans (or steps) for a series of x-coordinate positions.

The mirror shape information is used to improve the alignment of the stage. In this regard, a distance correction algorithm may be used which can be implemented with a look up table (LUT) or polynomial or Fourier series closed form approximation to adjust distance measurements. Corrections of the order of $1/10$ of a nanometer are possible. The foregoing process may be implemented via a suitably programmed general purpose computer or via dedicated microprocessors that additionally may be used to exercise overall control of system hardware elements, provide a user interface for system control and human intervention, and perform general housekeeping functions.

Data acquired during a single scan may comprise statistical errors sufficiently large so as to limit the value of the data in determining a change in the shape of a mirror. However, for changes in the shape of the mirror that occur at temporal frequencies << than the temporal frequency associated with the time required to scan a single wafer or the time required to scan a given set of wafers comprising two or more, the data acquired from the multiple scans of the single wafer or the data acquired during the scans of the set of wafers may be averaged together to reduced the standard deviation of the data to a level sufficient to enhance the value of the data in determining the change in the shape of the mirror.

Interferometry systems 10 and 20 can each include multiple distance measuring interferometers (e.g., HSPMIs) or a multi-axis interferometer for measuring multiple degrees of freedom (see, e.g., "Differential Interferometer Arrangements for Distance and Angle Measurements: Principles, Advantages, and Applications, C. Zanoni, VDI Berichte NR. 749, (1989), the contents of which are included herein by reference). Furthermore, in some embodiments, one or both of interferometry systems 10 and 20 can be a single beam interferometers.

In fact, single beam interferometers may be preferred because they can measure pitch, yaw, and distance (P, Y, and D) with only a single beam going to each stage mirror. An important feature of the use of single beam interferometers for this application is it contains all spatial frequencies up to the cutoff frequency given by 1/d, where d is the beam diameter whereas use of a double-beam interferometer, such as a HSPMI, would cause loss of all spatial frequencies that have wavelengths equal to the beam spacing of the two double beams or harmonics thereof so that the higher spatial frequency components of the shape could not be recovered.

A single beam interferometer (SBI) is an interferometry system that maintains its measurement beam normal to the stage mirror object over a range of angular orientations of the stage. Because the measurement beam is maintained substantially normal to the plane mirror, a double pass of the measurement beam to the plane mirror is not necessary to provide accurate optical path length measurements. Thus, in some embodiments, the SBI directs the measurement beam to make only a single pass to the plane mirror. In other embodiments, however, multiple passes are still possible. In any case, at least a portion of the measurement beam reflected from the plane mirror is combined with a reference beam to produce an interferometric signal indicative of a change in optical path. Furthermore, because the measurement beam is maintained substantially normal to the plane mirror, the propagation direction of the measurement beam relative to the interferometer reference frame is indicative of the angular orientation of the measurement object. Thus, the direction of the measurement beam, or a beam derived from the measurement beam can be monitored to determine the angular orientation of the measurement object. Furthermore, in some embodiments, the direction of a portion of an input beam from which the measurement beam is derived may be used to determined the angular orientation of the measurement beam. In any case, the direction may be derived interferometrically by using, angle measuring interferometers based on, e.g., an etalon or grating pair. Angle measuring interferometers include differential angle displacement interferometers and angle displacement interferometers. Differential angle displacement interferometers determine the difference in propagation directions between beams. Angle displacement interferometers monitor the average propagation direction of one or more beams relative to a reference direction. As an alternative to angle measuring interferometers, beam direction may be derived by using a multielement photo-detector and imaging optics. Thus, by maintaining the measurement normal to the plane measurement mirror, the SBI can provide pitch, yaw, and distance (PYD) measurements using a single measurement beam.

To maintain the measurement beam normal to the plane mirror, the SBI may be passive or dynamic. Passive embodiments of the SBI include a beam conditioning portion in which an input beam (including, e.g., spatially separated components of the input beam) is directed to reflect at least once from the plane measurement mirror to produce a conditioned input beam, and an interferometer portion. Thus, information about the angular orientation of the plane measurement mirror is imparted to the conditioned input beam. The beam conditioning portion may further include an afocal magnification or demagnification system to scale the change in propagation direction imparted to the conditioned input beam. The conditioned input beam is then directed to an interferometer portion, which separates the conditioned input beam into the measurement beam and a reference beam. By directing the input beam to contact, at least once, the plane measurement mirror, the beam conditioning portion imparts a propagation direction to the conditioned input beam that causes the measurement beam in the interferometer portion to contact the plane measurement mirror at normal incidence.

Dynamic embodiments of the SBI include a dynamic beam steering element that is servo-ed to the orientation of the plane measurement minor to cause the measurement beam to contact the plane measurement minor at normal incidence. The dynamic element may direct the measurement beam, or a progenitor beam to the measurement beam, such as the input beam. The servo signal used to control the dynamic element may be derived from a measurement of the propagation direction of the measurement beam, or a beam derived from the measurement beam, after it has reflected from the plane measurement mirror.

In some cases, it may be useful to consider a passive SMBI as an example of a dynamic SMBI in which plane measurement mirror itself acts as the dynamic element.

Single beam interferometers and their use in microlithography systems is described in commonly owned U.S. patent application Ser. No. 10/229,297 entitled "INTERFEROMETRIC STAGE SYSTEM" by Henry A. Hill and filed 26 Aug. 2002, the contents of which are incorporated herein by reference. Passive, zero-shear, single beam interferometers are described in even greater detail in commonly owned U.S. patent application Ser. No. 10/207,314 entitled "PASSIVE ZERO SHEAR INTERFEROMETERS" by Henry A. Hill and filed 29 Jun. 2002, the contents of which are incorportated herein by reference. Dynamic single beam interferometers are described in even greater detail in U.S. patent application Ser. No. 10/226,591 entitled "DYNAMIC INTERFEROMETER CONTROLLING DIRECTION OF INPUT BEAM" by Henry A. Hill and filed 23 Aug. 2002, U.S. Pat. No. 6,313,918 entitled "SINGLE-PASS AND MULTI-PASS INTERFEROMETRY SYSTEMS HAVING A DYNAMIC BEAM-STEERING ASSEMBLY FOR MEASURING DISTANCE, ANGLE, AND DISPERSION" by Henry A. Hill et al., and U.S. Pat. No. 6,271,923 entitled "INTERFEROMETRY SYSTEM HAVING A DYNAMIC BEAM STEERING ASSEMBLY FOR MEASURING ANGLE AND DISTANCE" by Henry A. Hill, the contents of which are incorporated herein by reference.

In further embodiments, the mirror characterization can be extended to accounted for out-plane-rotation, particularly, where stage is translated along the z-coordinate. SBIs are especially useful for this because they provide both pitch and yaw information, in addition to distance.

Figure 2:
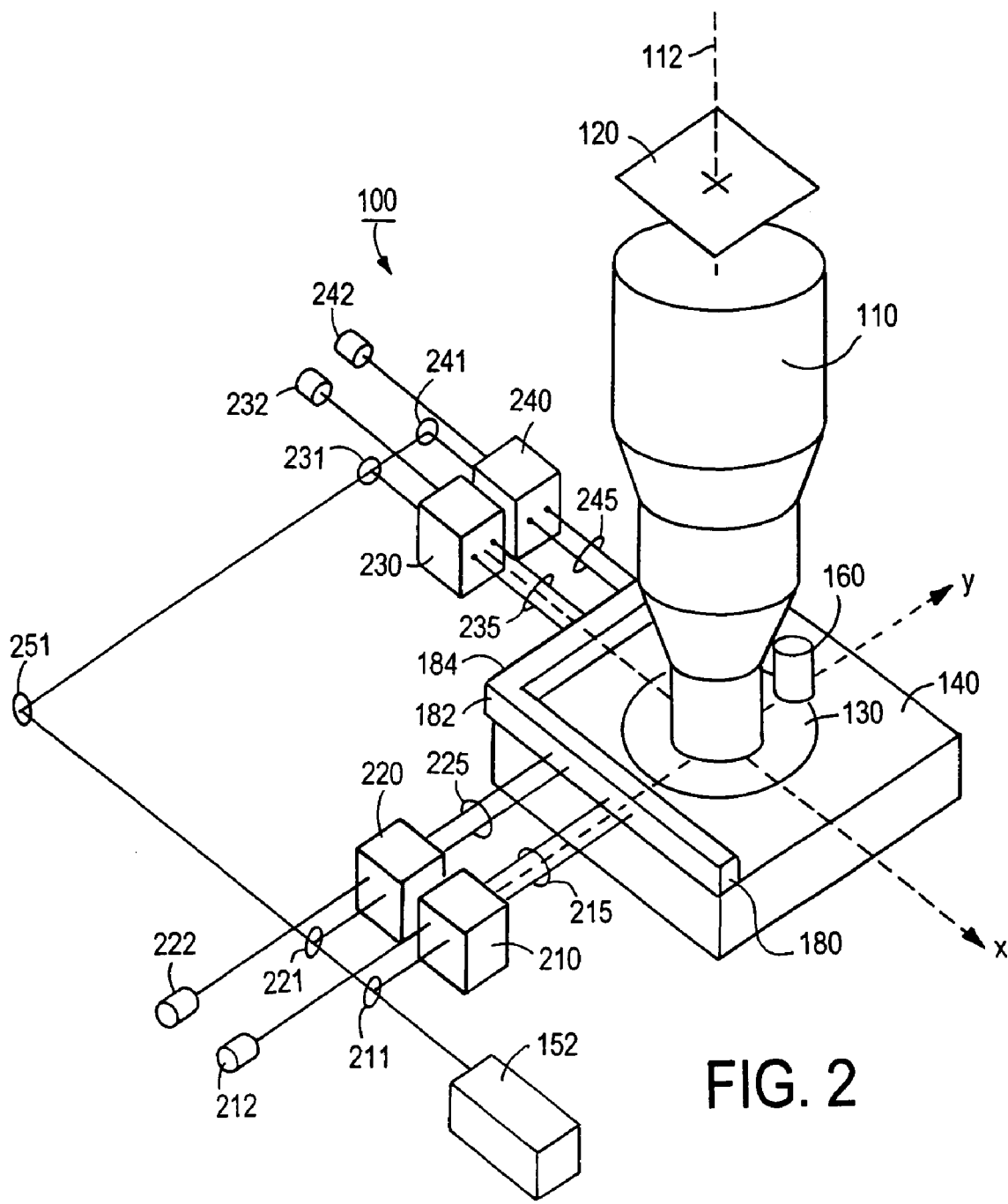
FIG. 2 is a perspective view of an embodiment of a lithography tool.
Figure 3:
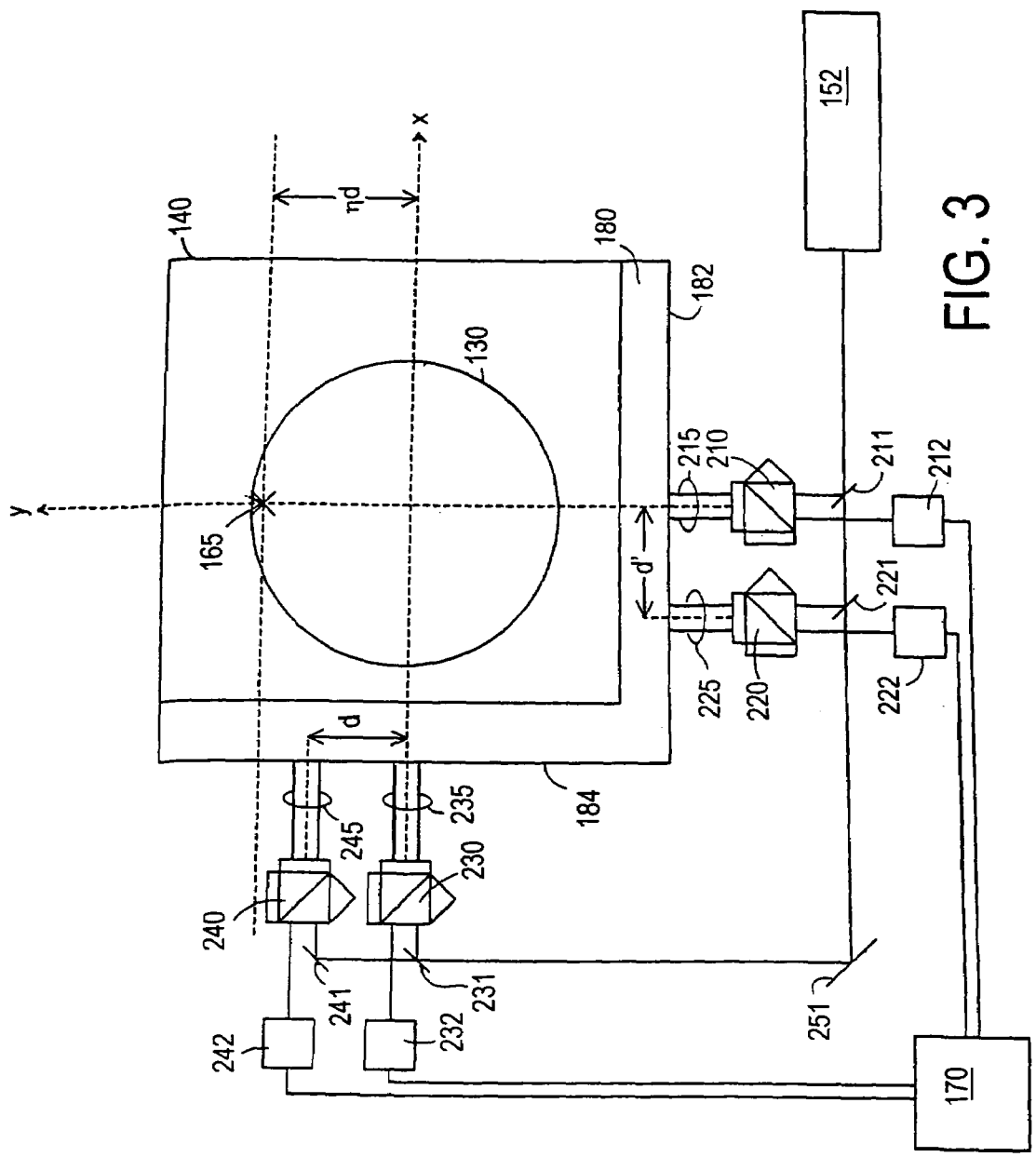
FIG. 3 is a plan view of the stage and interferometry system of the lithography tool shown in FIG. 2.

Now referring to FIGS. 2 and 3, one embodiment of the lithography system in which the in-process mirror characterization is performed is now described in greater, as is the characterization itself. An exemplary lithography tool 100 includes an exposure system 110 positioned to image a reticle 120 onto an exposure region of a wafer 130. Wafer 130 is supported by a stage 140, which scans wafer 130 in a plane orthogonal to an axis 112 of exposure system 110. A stage mirror 180 is mounted on stage 140. Stage mirror 180 includes two nominally orthogonal reflecting surfaces 182 and 184.

An interferometry system monitors the position of stage 140 along orthogonal x- and y-measurement axes. The x- and y-axes intersect with axis 112 of exposure system 10. The interferometry system includes four interferometers 210, 220, 230, and 240. Interferometers 210 and 220 respectively direct measurement beams 215 and 225 parallel to the y-axis to reflect from mirror surface 182. Similarly, interferometers 230 and 240 respectively direct measurement beams 235 and 245 parallel to the x-axis to reflect twice from mirror surface 184. After reflection from the mirror surfaces, each measurement beam is combined with a reference beam to form an output beam. A phase of each output beam is related to the optical path length difference between the measurement and reference beam paths. Detectors 212, 222, 232, and 242 detect the output beams from interferometers 210, 220, 230, and 240, respectively, and communicate optical path length difference information to an electronic controller 170, which determines the stage position from the information and adjusts the position of stage 140 relative to reticle 120 accordingly.

The input beam for each interferometer is derived from a common source, laser light source 152. Beam splitters 211, 221, 231, and mirrors 241 and 251 direct light from light source 152 to the interferometers. Each interferometer splits its input beam into a measurement beam and a reference beam. In the present embodiment, each interferometer directs its respective measurement beam along a path that contacts a surface of mirror 180 twice.

Interferometers 230 and 210 monitor co-ordinates $x_1$ and $y_1$ of the location of mirror surfaces 184 and 182 along the x- and y-axes, respectively. Additionally, interferometers 240 and 220 monitor the location of stage 140 along a second set of axes, offset from but parallel to the x- and y-axes, respectively. The secondary measurements provide co-ordinates $x_2$ and $y_2$ of mirror surfaces 184 and 182, respectively. The separations of these secondary measurement axes from the x- and y-axes are known, and are indicated as d and d' in FIG. 3.

Figure 4:
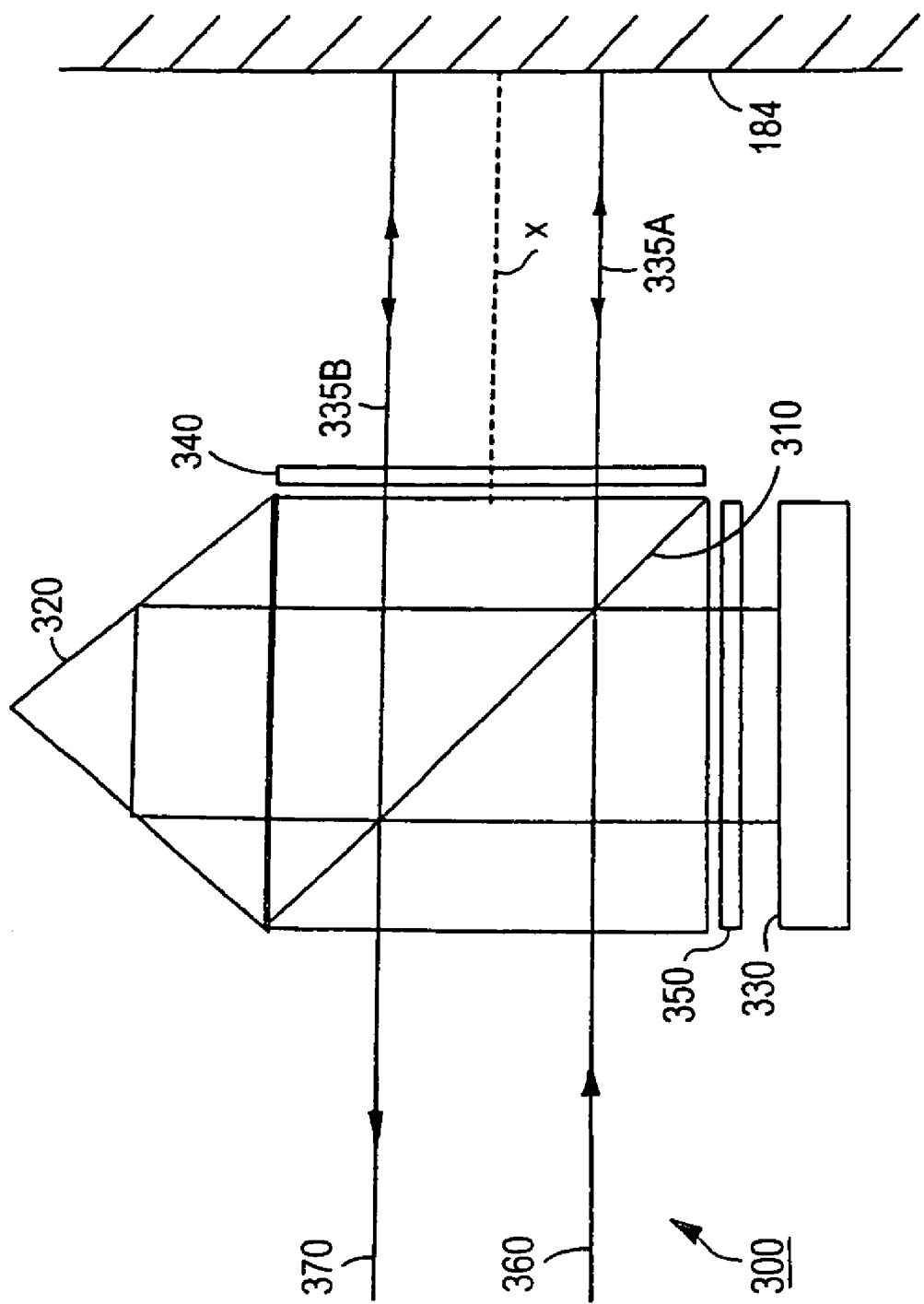
FIG. 4 is a schematic of a high stability plane mirror interferometer.

In some embodiments, interferometers 210, 220, 230, and 240 are high stability plane mirror interferometers (HSPMIs). Referring to FIG. 4, an HSMPI 300 includes a polarizing beam splitter (PBS) 310, a retroreflector 320, and a reference mirror 330. HSPMI 300 also includes quarter wave plates 340 and 350, positioned between PBS 310 and mirror surface 184 or reference mirror 330, respectively.

During operation, PBS 310 splits the input beam, indicated as beam 360 in FIG. 4, into orthogonally polarized components. One component, measurement beam 335A, is transmitted by PBS 310 and reflects from mirror surface 184 back towards PBS 310. On its return to PBS 310, the polarization state of the measurement beam is now orthogonal to its original polarization state due to the passing through quarter wave plate 340 twice, and the measurement beam is reflected by PBS 310 towards retroreflector 320. Retroreflector 320 directs the measurement beam back towards PBS 310, which reflects the measurement beam towards mirror surface 184. On the second pass to mirror surface 184, the measurement beam is indicated as beam 335B. Again, mirror surface 184 reflects beam 335B towards PBS 310. The double pass through quarter wave plate 340 transforms the polarization state of the measurement beam back to its original state, and it is transmitted by PBS 310 and exits HSPMI 300 as a component of an output beam 370.

The reference beam is the component of input beam 360 initially reflected by PBS 310. The reference beam passes between PBS 310 and reference mirror 330 twice. On each pass, quarter wave plate 350 transforms the polarization state of the reference beam by 90°. Thus, after the first pass of the reference beam to reference mirror 330, PBS 310 transmits the reference beam. After the reference beam's second pass to reference mirror 330, PBS 310 reflects the reference beam, which exits the interferometer 300 as a component of output beam 370.

Displacement measuring interferometers other than HSP-MI's can also be used in system 100. Examples of other displacement measuring interferometers include single beam interferometers and/or high accuracy plane mirror interferometers (in which the measurement beam can pass to the measurement object more than twice, e.g., four times). Furthermore, although the foregoing discussion includes a description of heterodyne interferometry, homodyne detection schemes can also be used.

Referring again to FIG. 2 and FIG. 3, lithography tool 100 also includes an alignment scope 160, positioned off-axis from axis 112. Alignment scope 160 is positioned to locate objects at a position on the y-axis, offset from the x-axis by an amount $\eta d$. In the present embodiment, a user locates an alignment mark with alignment scope 160. Because the position of alignment scope 180 with respect to exposure system 110 and the x- and y-axes is known, once the user locates alignment mark 165 with the scope, tile location of the alignment mark with respect to the exposure system is known. The values of $x_1$, $x_2$, $y_1$, and $y_2$ that are measured once the user has located alignment mark 165 provide a set of reference co-ordinates indicative of the alignment mark's location on the stage. Based on these reference co-ordinates, the user can accurately translate the wafer on the stage with respect to the exposure system to locate target regions of the wafer on axis 112.

Figure 5:
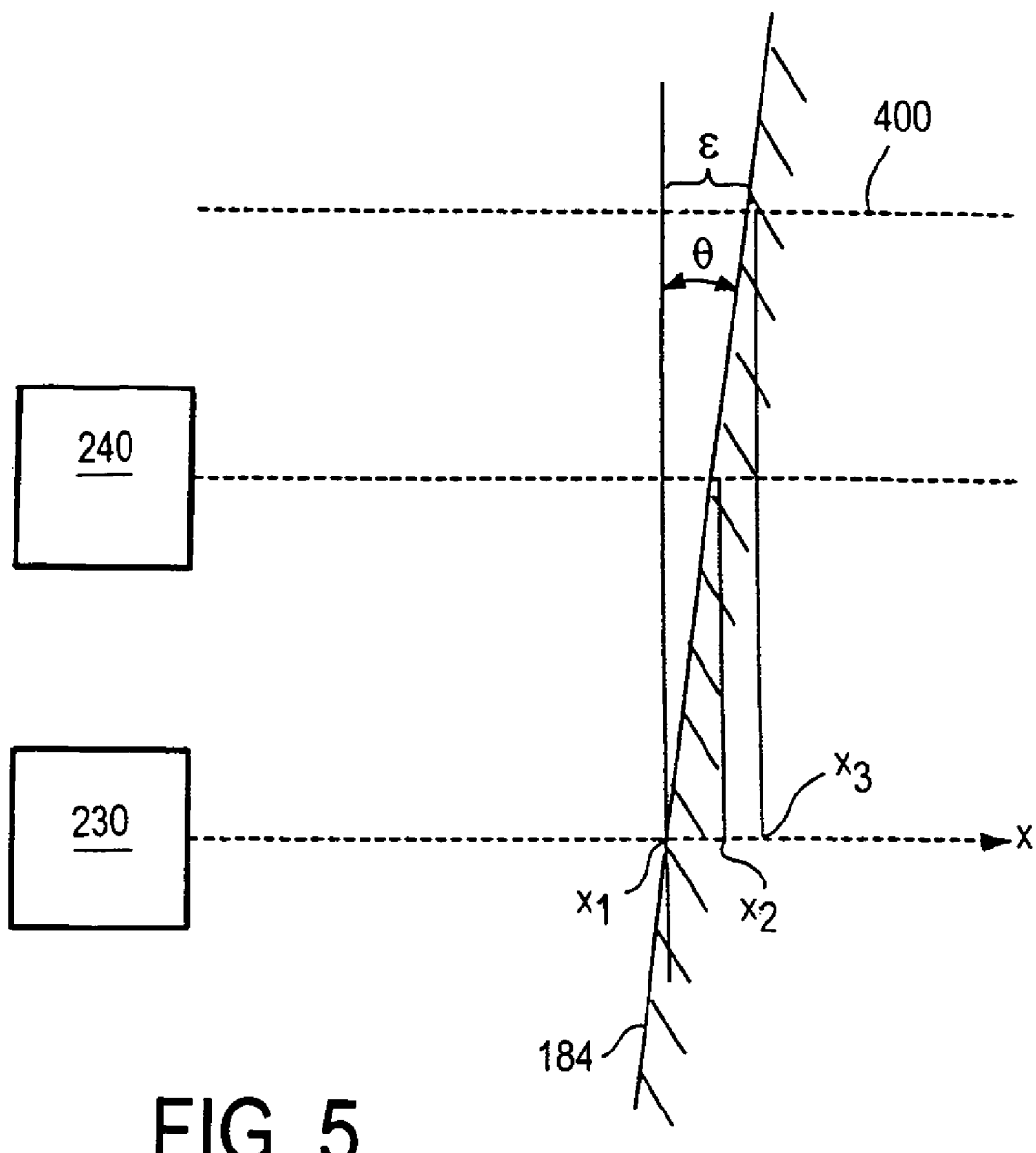
FIG. 5 is a schematic showing an Abbe offset error.

Any repositioning of the stage based on the reference co-ordinates should account for the angular orientation of the stage when alignment mark 165 is located by alignment scope 160. The effect of stage orientation is illustrated in FIG. 5, which shows the first and second measurement axes as well as an axis 400, parallel to the x-axis, on which the alignment scope is located. The location of the mirror along these axes is given by $x_1$, $x_2$, and $x_3$, respectively. Where $\theta$ is zero, $x_1=x_2=x_3$. However, for non-zero $\theta$, $x_3-x_1=\eta d \tan\theta \equiv \epsilon$. The offset, $\epsilon$, is referred to as the Abbe offset error.

For a perfectly flat mirror and for small $\theta$, $$\theta = \frac{x_2 - x_1}{d}, \quad (1)$$

however, as discussed previously, imperfections in the mirror surface (e.g., surface unevenness and/or local slope variations) introduce errors into the interferometrically observed values of $x_1$ and $x_2$. Hereinafter, observable parameters are indicated by a tilde. Subsequently, interferometers 230 and 240 measure $\tilde{x}_1$ and $\tilde{x}_2$, respectively, wherein $\tilde{x}_1 = x_1 + \psi_1$ and $\tilde{x}_2 = x_2 + \psi_2$, where $\psi_1$ and $\psi_2$ represent deviations of the measured values from those for a perfect mirror. Substituting $\tilde{x}_1$ and $\tilde{x}_2$ for $x_1$ and $x_2$ in Eq. (1), yields $$\theta = \frac{(\tilde{x}_2 - \tilde{x}_1)}{d} - \frac{(\psi_2 - \psi_1)}{d}. \quad (2)$$

Accordingly, for small $\theta$, the Abbe offset error becomes $$\varepsilon = \eta d \left[ \frac{\tilde{x}_2 - \tilde{x}_1}{d} - \frac{\psi_2 - \psi_1}{d} \right], \quad (3)$$

which can be recast as $$\tilde{x}_3 = \tilde{x}_1 + \eta d \frac{\tilde{x}_2 - \tilde{x}_1}{d} - \psi_3, \quad (4)$$

where $\psi_3$ is an error correction term accounting for imperfections in the surface of the mirror.

The error correction terms $\psi_1$, $\psi_2$, and $\psi_3$, can be determined from a mirror map, preferably measured in-process, during the photolithography exposure cycle, as described above. For the mirror characterization, when stage 140 is translated in the y-direction, measurement bean 235 and 245 of interferometers 230 and 240, respectively, scans mirror surface 184 along a datum line and generates signals containing information indicative of its angular orientation and apparent surface departure (i.e., surface unevenness) in the x-y plane from a plane in the x-direction, along with any contributions due to variations in the translation mechanism for moving stage 140 and other sources of error (e.g., cyclic non-linearities, and stationary and non-stationary effects of a gas in measurement paths of beams of interferometers 230 and 240). The scan produces $\tilde{X}_1(y)$ and $\tilde{X}_2(y)$, corresponding to displacement measurements from interferometers 230 and 240 respectively.

Simultaneous with translation of stage 140 in the y-direction, interferometers 210 and 220 monitor the orientation of mirror surface 182 for fixed intercept points of measurement beams 215 and 225 with surface 182. This step permits measurement of the rotation of stage 140 due to mechanical contributions of its translation mechanism, such as bearings, drive mechanisms, and the like. Measurement of the angular orientation of mirror surface 182 provides a redundant measure of the angular orientation, $\tilde{\theta}(y)$, of stage 140 during the scan, which can be used to remove the contribution of angular rotations of stage 140 from the $\tilde{X}_1(y)$ and $\tilde{X}_2(y)$ data.

Once corrected for angular rotations of stage 140, $\tilde{X}_1(y)$ and $\tilde{X}_2(y)$ provides a measure of the average slope of mirror surface 184 along the datum line. Where there is no contribution from stage rotations, the average slope, $<dx/dy>_{Map}$, is given by $$\langle dx/dy \rangle_{Map}(y) = \frac{\tilde{X}_2(y) - \tilde{X}_1(y)}{d}, \quad (5)$$

where the subscript Map refers to data acquired during the mirror mapping mode. A linear fit to the $<dx/dy>_{Map}$ data yields $<dx/dy>_{fit}$, which provides a nominal reference surface.

This mirror characterization information can be used to compensate the interferometric measurements for mirror deformation during operation. For example, the errors associated with mirror surface imperfections can be sent to a control system that controls the orientation of stage 140, thereby preventing transferal of these errors to the position of the stage.

Furthermore, the off-axis error function $\psi_3$ can be then determined according to deviations of the mirror surface from $<dx/dy>_{fit}$ based on the formalism disclosed in U.S. Provisional Patent Application Ser. No. 60/517,426 by Henry A. Hill filed Nov. 4, 2003 and entitled "Compensation for Errors in Off-Axis interferometric Measurements," the contents of which are incorporated herein by reference.

Lithography tools, such as tool 100, are especially useful in lithography applications used in fabricating large scale integrated circuits such as computer chips and tile like. Lithography is the key technology driver for the semiconductor manufacturing industry. Overlay improvement is one of the five most difficult challenges down to and below 100 nm line widths (design rules), see, for example, the *Semiconductor Industry Roadmap*, p.82 (1997).

Overlay depends directly on the performance, i.e., accuracy and precision, of the distance measuring interferometers used to position the wafer and reticle (or mask) stages. Since a lithography tool may produce $50–100M/year of product, tile economic value from improved performance distance measuring interferometers is substantial. Each 1% increase in yield of the lithography tool results in approximately $1M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

As discussed previously, to properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce at 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as cyclic error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer states. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 6A:
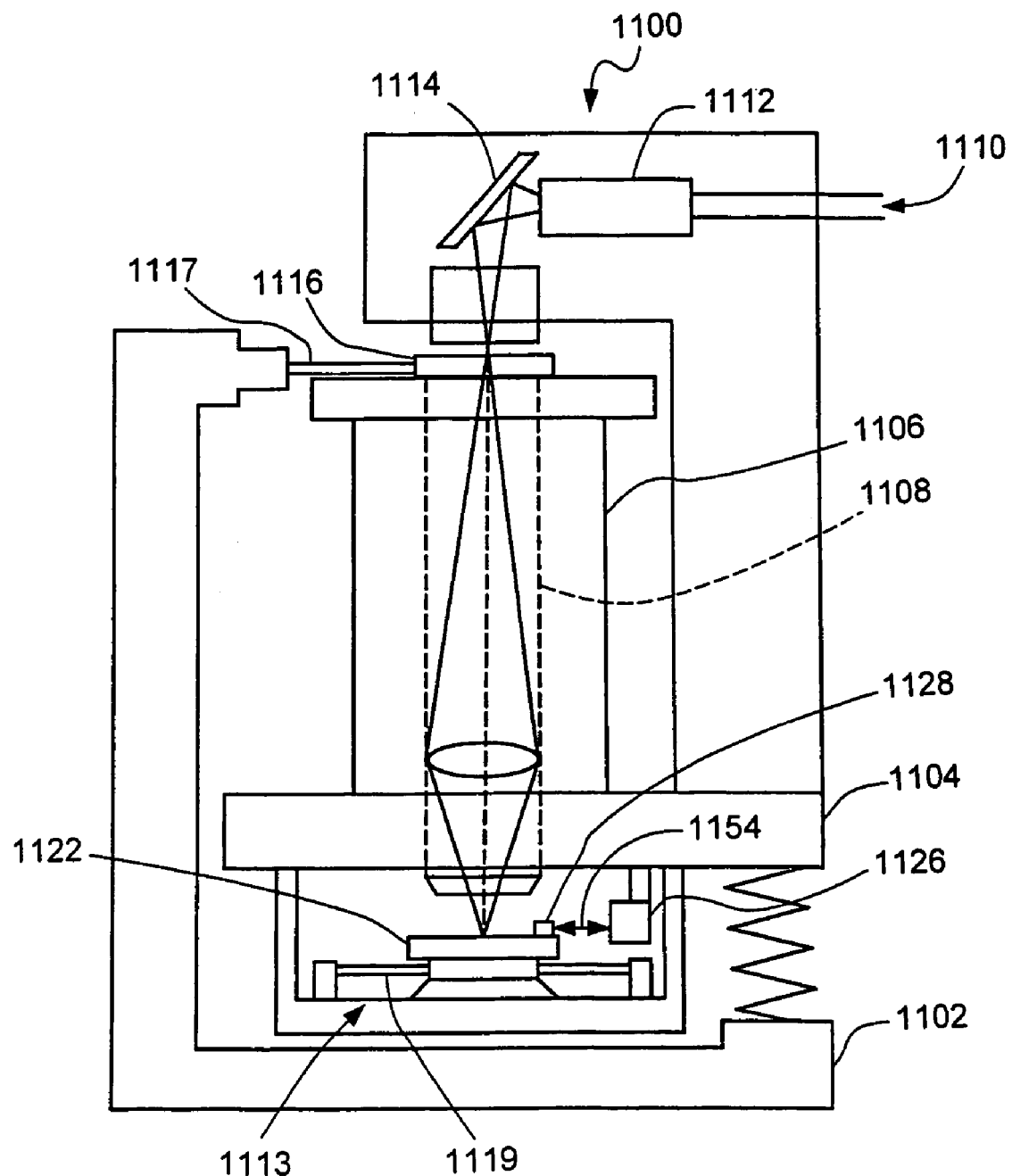
FIG. 6(a) is a schematic diagram of an embodiment of a lithography tool that includes an interferometer.

Another example of a lithography tool 1100 using an interferometry system 1126 is shown in FIG. 6a. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beams, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stare 1116 or other movable components of the scanner system. Finally, the interferometry systems can be used in a similar fashion with lithography systems involving steppers, in addition to, or rather than, scanners.

Figure 6B:
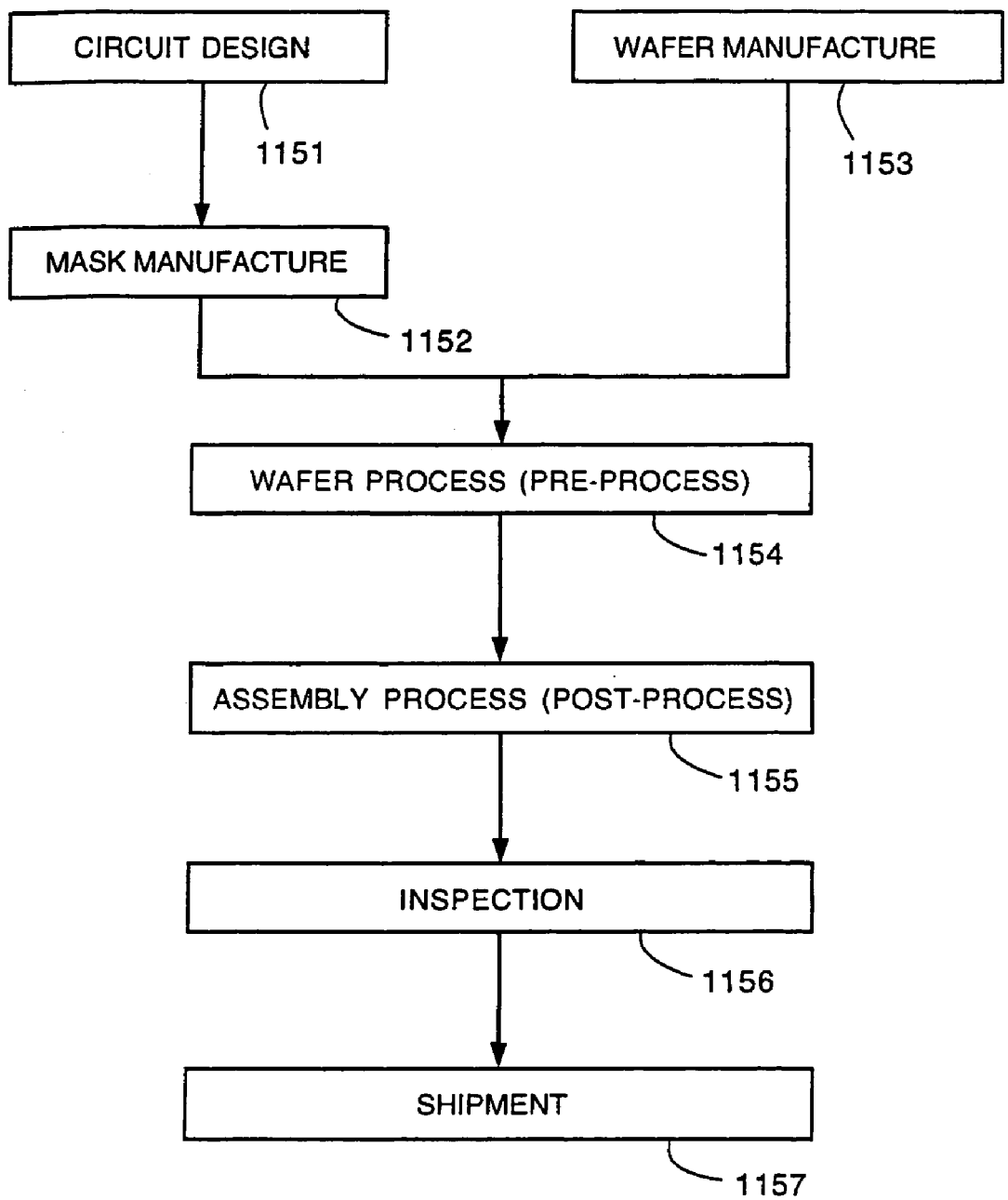
FIG. 6(b) and FIG. 6(c) are flow charts that describe steps for making integrated circuits.
Figure 6C:
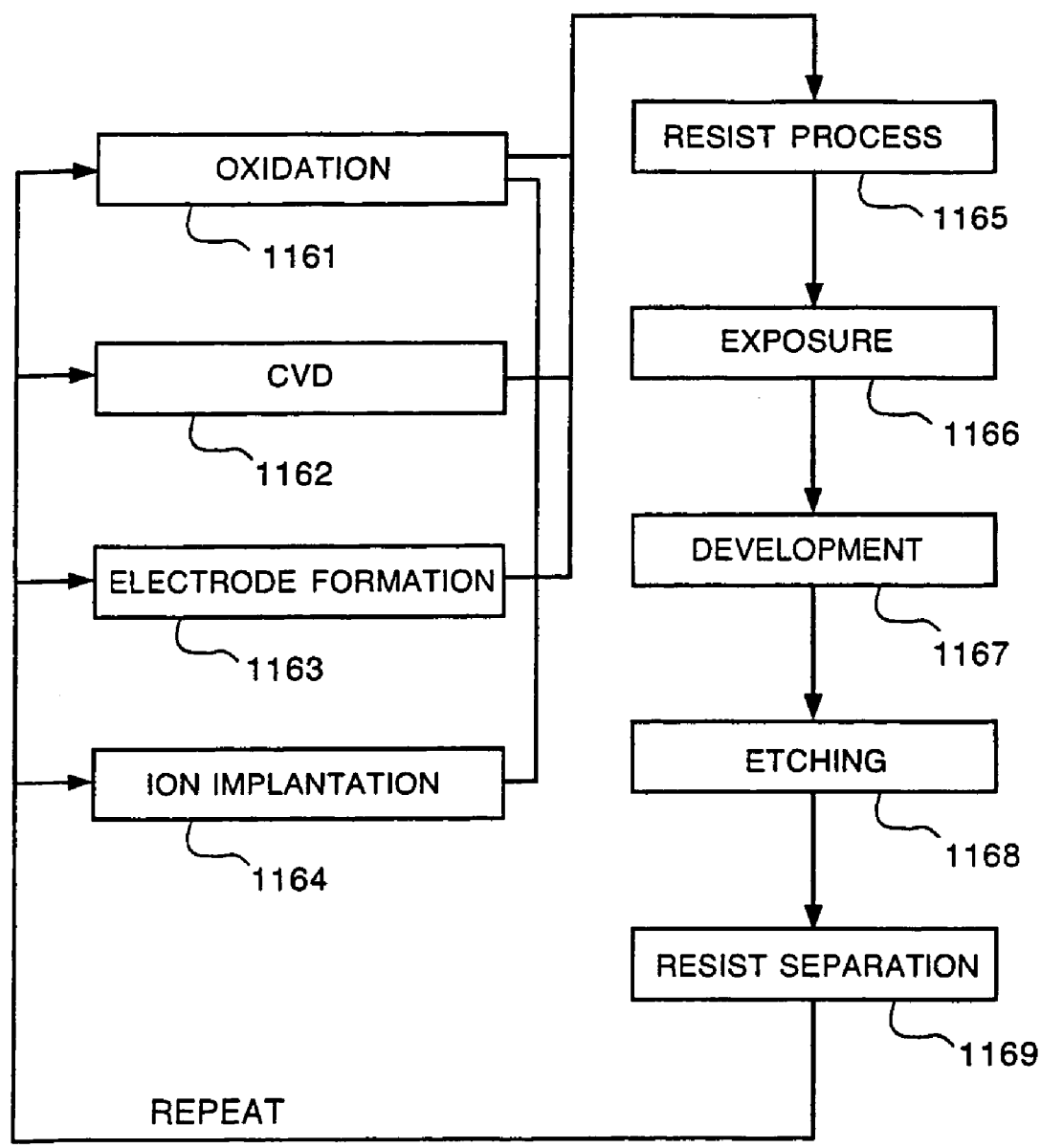

As is well known in the art, lithography is a critical part of manufacturing methods for making semiconducting devices. For example, U.S. Pat. No. 5,483,343 outlines steps for such manufacturing methods. These steps are described below with reference to FIGS. 6(*b*) and 6(*c*). FIG. 6(*b*) is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

FIG. 6(*c*) is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on tile wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 7:
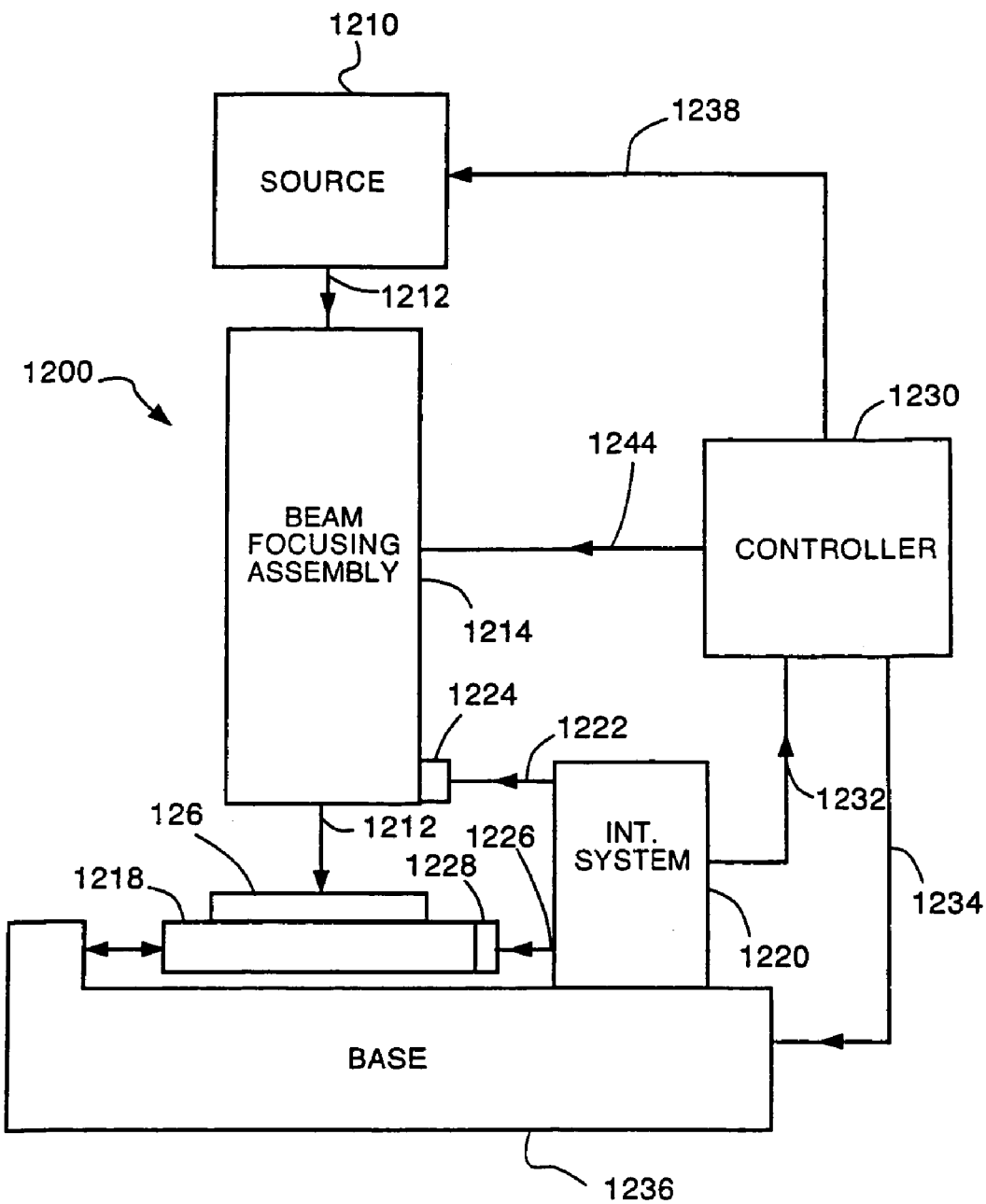
FIG. 7 is a schematic of a beam writing system that includes an interferometry system.

As an example, a schematic of a beam writing system 1200 is shown in FIG. 7. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a minor mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention. Accordingly, other embodiments are within the scope of the following claims.

What is claimed is:

1. A microlithography method including:
   interferometrically measuring information about a position of a microlithography stage with respect to each of multiple metrology axes during a photolithographic exposure cycle;
   analyzing the position information to determine correction factors indicative of local slope oil a side of the stage used to reflect an interferometric measurement beam and optical gradients caused by environmental effects produced by the photolithographic exposure cycle; and
   applying the correction factors to subsequent interferometric measurements of the stage.

2. The method of claim 1, wherein the stage carries a wafer exposed to illumination light during the photolithographic exposure cycle.

3. The method of claim 1, wherein the stage carries a reticle through which illumination light passes to expose a wafer during the photolithographic exposure cycle.

4. The method of claim 1, wherein the information is measured when exposing a first region of a wafer during the photolithography exposure cycle, and wherein the correction factors are applied to subsequent interferometric measurements of the stage when exposing subsequent regions or layers of the wafer during the photolithography exposure cycle.

5. The method of claim 1, wherein the information is measured when exposing a first region of a wafer during the photolithography exposure cycle, and wherein the correction factors are applied to subsequent interferometric measurements of the stage when exposing a region of another wafer during its photolithography exposure cycle.

6. The method of claim 1, wherein the correction factors are determined based on averaging information for multiple scans of the stage along at least a first direction.

7. The method of claim 1, wherein the position information is measured using at least one high stability plane mirror interferometer.

8. The method of claim 1, wherein the position information is measured using at least one single beam interferometer.

9. The method of claim 8, wherein the single beam interferometer is a dynamic single beam interferometer.

10. The method of claim 8, wherein the single beam interferometer is a passive single beam interferometer.

11. The method of claim 1, wherein the correction factors are indicative of the local slope on at least two sides of the stage used to reflect an interferometric measurement beam.

12. The method of claim 1, wherein the correction factors are indicative of the local slope of the side of the stage along an in-plane direction.

13. The method of claim 1, wherein the multiple metrology axes provide redundant information about the stage position in the absence of the local slope and optical gradient variations.

14. A method comprising fabricating integrated circuits using the lithography method of claim 1.

15. A microlithography method including:
   interferometrically measuring information about a position of a microlithography stage with respect to each of multiple metrology axes during a photolithographic exposure cycle using a single-wavelength interferometer;
   analyzing the position information to determine correction factors indicative of a local slope on a side of the stage used to reflect an interferometric measurement beam and optical gradients caused by environmental effects produced by the photolithographic exposure cycle; and
   applying the correction factors to subsequent interferometric measurements of the stage.

16. The method of claim 15, wherein the stage carries a wafer exposed to illumination light during the photolithographic exposure cycle.

17. The method of claim 15, wherein the stage carries a reticle through which illumination light passes to expose a wafer during the photolithographic exposure cycle.

18. The method of claim 15, wherein the information is measured when exposing a first region of a wafer during the photolithography exposure cycle, and wherein the correction factors are applied to subsequent interferometric measurements of the stage when exposing subsequent regions or layers of the wafer during the photolithography exposure cycle.

19. The method of claim 15, wherein the information is measured when exposing a first region of a wafer during the photolithography exposure cycle, and wherein the correction factors are applied to subsequent interferometric measurements of the stage when exposing a region of another wafer during its photolithography exposure cycle.

20. The method of claim 15, wherein the correction factors are determined based on averaging information for multiple scans of the stage along at least a first direction.

21. The method of claim 15, wherein the position information is measured using at least one high stability plane mirror interferometer.

22. The method of claim 15, wherein the position information is measured using at least one single beam interferometer.

23. The method of claim 15, wherein the correction factors are indicative of the local slope on at least two sides of the stage used to reflect an interferometric measurement beam.

24. The method of claim 15, wherein the correction factors are indicative of the local slope of the side of the stage along an in-plane direction.

25. The method of claim 15, wherein the multiple metrology axes provide redundant information about the stage position in the absence of the local slope and optical gradient variations.

26. A method comprising fabricating integrated circuits using the lithography method of claim 15.

* * * * *

UNITED STATES PATENT AND TRADEMARK OFFICE
CERTIFICATE OF CORRECTION

PATENT NO.        : 7,075,619 B2
APPLICATION NO.   : 10/734994
DATED             : July 11, 2006
INVENTOR(S)       : Henry A. Hill It is certified that error appears in the above-identified patent and that said Letters Patent is hereby corrected as shown below:

Column 1
Line 52, before "important" delete "is"
Line 65, replace "the –axis" with --the -axis--
Line 66, replace "the–wafer" with --the - wafer--

Column 3
Line 55, replace "In" with --An--

Column 5
Line 30, insert --be-- between "may" and "measured"

Column 6
Line 56, replace "tile" with --the--

Column 7
Line 15, delete second occurrence of "datum line"

Column 9
Line 18, replace "minor" with --mirror--
Line 19, replace "minor" with --mirror--
Line 56, replace "accounted" with --account--
Line 64, replace "greater," with --greater detail,--

Column 10
Line 6, replace "10" with --110--

Column 13
Line 15, replace "tile" with --the--
Line 24, replace "tile" with --the--

Column 16
Line 28, replace "tile" with --the--
Line 47, replace "minor" with --mirror--

UNITED STATES PATENT AND TRADEMARK OFFICE
CERTIFICATE OF CORRECTION

PATENT NO. : 7,075,619 B2
APPLICATION NO. : 10/734994
DATED : July 11, 2006
INVENTOR(S) : Henry A. Hill It is certified that error appears in the above-identified patent and that said Letters Patent is hereby corrected as shown below:

Column 17
Line 32, replace "oil" with --on--

Signed and Sealed this

Thirteenth Day of November, 2007

JON W. DUDAS
*Director of the United States Patent and Trademark Office*